United States Patent
Narducci

(10) Patent No.: US 9,484,517 B2
(45) Date of Patent: Nov. 1, 2016

(54) SEEBECK/PELTIER BIDIRECTIONAL THERMOELECTRIC CONVERSION DEVICE USING NANOWIRES OF CONDUCTIVE OR SEMICONDUCTIVE MATERIAL

(75) Inventor: Dario Narducci, Milan (IT)

(73) Assignee: CONSORZIO DELTA TI RESEARCH, Milan (IT)

( * ) Notice: Subject to any disclaimer, the term of this patent is extended or adjusted under 35 U.S.C. 154(b) by 337 days.

(21) Appl. No.: 12/937,058

(22) PCT Filed: Apr. 2, 2009

(86) PCT No.: PCT/IB2009/051390
§ 371 (c)(1),
(2), (4) Date: Dec. 22, 2010

(87) PCT Pub. No.: WO2009/125317
PCT Pub. Date: Oct. 15, 2009

(65) Prior Publication Data
US 2011/0083713 A1    Apr. 14, 2011

(30) Foreign Application Priority Data

Apr. 11, 2008  (IT) .............................. RM2008A0193

(51) Int. Cl.
*H01L 35/00* (2006.01)
*H01L 35/28* (2006.01)
*H01L 35/30* (2006.01)
*H01L 35/32* (2006.01)
*H01L 35/34* (2006.01)

(52) U.S. Cl.
CPC ............... *H01L 35/32* (2013.01); *H01L 35/34* (2013.01)

(58) Field of Classification Search
CPC ....... H01L 35/00; H01L 35/02; H01L 35/04; H01L 35/08; H01L 35/10; H01L 35/32; H01L 35/34
USPC .......................................... 136/224
See application file for complete search history.

(56) References Cited

U.S. PATENT DOCUMENTS

| 3,261,079 | A | * | 7/1966 | Clingman, Jr. | ......... H01L 35/34 136/201 |
| 5,022,928 | A | * | 6/1991 | Buist | ............................. 136/212 |
| 5,994,164 | A | * | 11/1999 | Fonash | ............... H01L 21/2022 257/E21.133 |
| 6,043,423 | A | * | 3/2000 | Satomura | ................ H01L 35/08 136/203 |

(Continued)

FOREIGN PATENT DOCUMENTS

| JP | 11-068173 A | 3/1999 |
| JP | 2004-056866 A | 2/2004 |

(Continued)

OTHER PUBLICATIONS

Li et al., Atomic Layer Deposition of Ultrathin Copper Metal Films from a Liquid Copper(I) Amidinate Precursor, Journal of the Electrochemical Society, 153 (11) C787-C794 (2006).*

(Continued)

*Primary Examiner* — Luan Van
*Assistant Examiner* — Angelo Trivisonno
(74) *Attorney, Agent, or Firm* — Polsinelli PC

(57) ABSTRACT

The invention relates to Seebeck/Peltier bidirectional thermoelectric conversion devices and in particular to devices employing nanowires of conductive or semiconductive material defined on a substrate by common planar technologies.

13 Claims, 2 Drawing Sheets

(56) References Cited

U.S. PATENT DOCUMENTS

| | | | | |
|---|---|---|---|---|
| 6,593,519 B2* | 7/2003 | Kubo | ................... | H01L 35/28 136/224 |
| 2004/0123489 A1* | 7/2004 | Pancheri | ............... | D06F 58/203 34/597 |
| 2005/0112872 A1* | 5/2005 | Okamura et al. | ............. | 438/666 |
| 2005/0241690 A1* | 11/2005 | Tajima | ................... | H01L 35/10 136/212 |
| 2006/0102224 A1* | 5/2006 | Chen | ................... | H01L 35/16 136/203 |
| 2006/0266402 A1* | 11/2006 | Zhang | ................... | H01L 35/30 136/205 |
| 2007/0277866 A1* | 12/2007 | Sander | ................... | H01L 35/34 136/230 |
| 2009/0223548 A1* | 9/2009 | Walitzki | ................. | H01J 45/00 136/205 |

FOREIGN PATENT DOCUMENTS

| | | |
|---|---|---|
| JP | 2004/241397 A | 8/2004 |
| JP | 2006/269763 A | 10/2006 |
| JP | 2007/059773 A | 3/2007 |
| JP | 2008-010704 A | 1/2008 |

OTHER PUBLICATIONS

Hueging et al., Evolution of the defect structure in helium implanted SiGe/Si heterostructures investigated by in situ annealing in a transmission electron microscope, Applied Physics Letters 86, 042112 (2005); doi: 10.1063/1.1852705.*

Li et al., "Atomic Layer Deposition of Ultrathin Copper Metal Films from a Liquid Copper(I) Amidinate Precursor," Journal of the Electrochemical Society, 153 (11) C787-C794 (2006).*

Hueging et al., "Evolution of the defect structure in helium implanted SiGe/Si heterostructures investigated by in situ annealing in a transmission electron microscope," Applied Physics Letters 86, 042112 (2005); doi: 10.1063/1.1852705.*

Li et al., "Thermal conductivity of individual silicon nanowires," Appl. Phys. Lett. 83, 2934 (2003); http://dx.doi.org/10.1063/1.1616981.*

Office Action issued in Japanese Application No. 2011-503524 dated Jun. 27, 2013.

Office Action issued in counterpart Japanese Application No. 2011-503524 dated Mar. 11, 2014.

* cited by examiner

SEEBECK/PELTIER BIDIRECTIONAL THERMOELECTRIC CONVERSION DEVICE USING NANOWIRES OF CONDUCTIVE OR SEMICONDUCTIVE MATERIAL

CROSS REFERENCE TO RELATED APPLICATIONS

This application is a National Phase filing under 35 U.S.C. §371 of PCT/IB2009/051390 filed on Apr. 2, 2009; and this application claims priority to Application No. RM2008A000193 filed in Italy on Apr. 11, 2008 under 35 U.S.C. §119; the entire contents of all are hereby incorporated by reference.

The invention relates in general to Seebeck/Peltier bidirectional thermoelectric conversion devices and in particular to devices using nanowires of conductor or semiconductor material defined on a substrate with planar technologies.

Seebeck effect is a thermoelectric phenomenon therefor in a circuit constituted by metallic conductors or semiconductors a temperature difference generates electricity. The effect, discovered by the physicist Thomas J. Seebeck in 1821, appears with the presence of a potential difference at the ends of a metallic bar subjected to a temperature gradient $\nabla T$. In a circuit wherein there are two junctions between two materials A and B placed at temperatures $T_1$ and $T_2$ the resulting voltage is given by:

$$V = \int_{T_1}^{T_2} [S_B(T) - S_A(T)] dT \quad (1)$$

wherein: $S_A$ and $S_B$ are the Seebeck coefficients (also called thermoelectric power) related to two materials A and B. The voltage values are typically in the order of some μV/K. The Seebeck coefficients are not linear and they depend upon the materials, upon the absolute temperature thereof and upon the structure thereof. It results that the Seebeck effect can be exploited both for implementing devices suitable to measure temperature differences as potential differences generated in a circuit constituted by wires of different material (thermocouple) and, by connecting in series a certain number of thermocouples, for generating electric energy (thermopile).

From the microscopic point of view the charge carriers (electrons in metals, electrons and holes in semiconductors, ions in ionic conductors) will spread when a conductor terminal is at a different temperature respect to the other one. The higher temperature carriers will spread towards the area at lower temperature, as long as there will be different carrier densities in the portion with lower temperature and in the one with higher temperature of the conductor. If the system is isolated, the equilibrium will be reached when, after the scattering process, the heat will uniformly be distributed through the whole conductor. The re-distribution of thermal energy due to the motion of charge carriers is called thermal current, and it is obviously associated to an electric current which will annul when the system temperature will have become uniform. In a system wherein the two junctions viceversa have a constant temperature difference, even the thermal current will be constant and then a constant flow of charge carriers will be noted. The mobility of the carriers is reduced by scattering phenomena (scattering) by the impurities which are present in the lattice, the structural defects and the reticular vibrations (phonons). Therefore, the Seebeck effect in a material depends very significantly upon the density of impurities and upon crystallographic defects of the material apart from the phonon spectrum of the material itself. The phonons, however, are not always in local thermal equilibrium. On the contrary, they move by following the thermal gradient and they lose energy by interacting with the electrons (or other carriers) and with the reticular imperfections. If the phonon-electron interaction is predominant, the phonons tend to push the electrons towards a material portion, loosing energy in the process, thus contributing to the already present electric field. This contribution is even more important in the temperature region wherein the phonon-electron scattering is predominant, that is for $$T \approx \frac{1}{5}\theta_D \quad (2)$$

wherein $\theta_D$ is the Debye temperature. At lower temperatures, fewer phonons are available for the transportation, whereas at high temperatures they tend to loose energy in phonon-phonon collisions rather than phonon-electron collisions.

The performance of a thermoelectric generator can be expressed as[1]

$$\eta_{max} = \frac{T_2 - T_1}{T_1} \frac{\left(1 + Z_{AB}\frac{T_2 + T_1}{2}\right)^{1/2} - 1}{\left(1 + Z_{AB}\frac{T_2 + T_1}{2}\right)^{1/2} + \frac{T_2}{T_1}} \quad (3)$$

wherein $Z_{AB}$ is a thermoelectric figure of merit of the material couple A-B. The performance tends towards a Carnot machine for $Z_{AB} \to \infty$. It is furthermore demonstrated that[1]:

$$Z_{AB} = \frac{(S_A - S_B)^2}{(K_A\rho_A + K_B\rho_B)^2} \quad (4)$$

wherein $K_A$ and $K_B$ are the thermal conductivities of A and B and $\rho_A$ and $\rho_B$ are the corresponding electric resistivities. It results then useful defining also a thermoelectric figure of merit of a material such as $$Z = \frac{S^2}{K\rho} \quad (5)$$

From the technological point of view the use of generators based upon the Seebeck effect has been often considered of potential interest. More than half heat produced in a thermal plant is usually dissipated as heat with low enthalpy, it is estimated that about 15 millions of megawatt are wasted only in the energy conversion processes. The availability of Seebeck generators, able to convert only partially such heat in electricity would be able to impact positively on the energy problem.

However, the thermoelectric generators have an extremely low efficiency. For example, in case of the massive silicon, at room temperature $Z \approx 3 \times 10^{-5} K^{-1}$; whereas values of $ZT \approx 1$ can be obtained only with materials of high cost and reduced availability such as $Bi_2Te_3$ or alloys thereof, for example, Sb or Se. In the facts, apart from some uses with high added value such as the thermoelectric generation in spatial environment, the thermoelectric generators based upon massive materials with high availability allow yields of converting thermal power into electric power of only about 7%. By way of comparison a turbine engine is able to convert about 20% of thermal energy into electric current.

Recently two collaborations operating at University of California in Berkeley[2] and of the California Institute of Technology in Pasadena[3] have shown that silicon nanowires with sizes transversal to the wire of 20 nm and with properly wrinkled surfaces are characterized by a high thermoelectric figure of merit. The rising of Z derives from the decoupling of the free average paths per phonons and electrons imposed by the scattering to the surfaces. In particular, the important contribution to the thermal conductivity deriving from the acoustic phonons with lower frequency (higher wavelength) is eliminated, thus the density of phonons with higher wavelength than the cross sizes of the wire itself resulting null. Consequently, the silicon thermal conductivity results to be reduced by $\approx 150$ W m$^{-1}$ K$^{-1}$ (at room temperature per massive Si) at 1.6 W m$^{-1}$ K$^{-1}$ (at room temperature per Si nanowires of 20 nm in section).

Moreover, the devices implemented by the two collaborations were produced with techniques unsuitable to the industrialization on a big scale. In the approach of the researchers of the University of California in Berkeley[2] the nanowires were obtained by chemical etching in baths of $AgNO_3$ and HF, by supplying in uncontrolled way nanowires with diameters variable between 20 and 300 nm (with average value of about 100 nm). The methodology adopted by the researchers of the California Institute of Technology[3] uses instead alternatively techniques of lithography with electronic beam or the method of transferring pattern from a superlattice to nanowire (Superlattice Nanowire Pattern Transfer), both extremely complex and expensive; furthermore the control of the surface wrinkledness of the wires results in this case modest and substantially determined by the growth modes.

An efficient structure of device for the Seebeck thermoelectric conversion was found, based upon the use of nanowires of conductor or semiconductor material defined on a substrate with not critical photolithographic definition and by using apparatuses of relatively low cost, on a wide range of substrate materials even with a particularly advantageous cost/performance ratio.

In the context of the present description, the term nanowire is meant to indicate a long thin body of electrically conductive or semiconductive material with the most extended meaning as established in the related scientific literature, able to allow the passage of an electrical current in presence of a potential difference between the ends thereof. The section of a nanowire can have any shape with at least a mean linear size or diameter lower than 40 nm.

Basically, a device according to the invention comprises:
at least an array of parallel nanowires spaced therebetween, rising from a planar area of the surface of a substrate of relatively low electric conductivity and low heat conductivity in the longitudinal direction of the parallel nanowires formed thereon and extending in length across the whole area or substantially so;
a layer of dielectric material of low heat conductivity filling the separation spaces between adjacent parallel nanowires of the array, and having thickness greater than the height of the nanowire;
electrical connections of the opposite ends of the nanowires according to a designed series-parallel scheme interconnecting the nanowires of the array among each other and the so-obtained electrical network of the device to an external circuit;
the surfaces coinciding with the opposite ends of the nanowires being constituting surfaces at different temperatures of the thermoelectric conversion device.

The substrate can be made of a material belonging to the group composed by a mono or multi-component glass, a silica aerogel, single-crystal or polycrystalline silicon with null or low concentration of dopants such to have a practically negligible electrical conductivity compared to the electrical conductivity of the material constituting the nanowires, an organic polymeric material resistant to the temperatures of the fabrication process and of operation temperatures of the conversion device, or materials with mechanical, dielectric characteristics equivalent thermal conductivity.

The features of low thermal conductivity of the substrate material and/or the geometrical shape thereof must be such to minimize each residual behaviour as "thermal bridge" along the longitudinal direction of the parallel nanowires formed on the substrate. Therefore, cellular materials such as aerogels or rigid polymeric and preferably expanded materials are preferred. Other substrates of compact materials may have grooves or transversal cross cavities with respect to the longitudinal axis of the nanowires to reduce the equivalent section of heat transmission.

The substrate can also be a laminated, wafer or multilayer stack of different materials or be constituted by a wafer of one of the materials mentioned above, wholly coated with a layer of another one of the mentioned materials, for example a monolith of silica aerogel coated with a film of polycrystalline silicon (briefly "polysilicon") of some tens of nanometers up to few micrometers in thickness.

The structure can be realized with a sequence of process steps which may include a single critical masking step, the definition limit of which (minimum line width) is significantly larger (by at least about one order of magnitude) than the width of the nanowires that are realized.

Such nanowires, though theoretically they can be made of any conductive material, according to the present disclosure are made of an element of the IV Group of the Periodic Table, preferably of Si, Ge or alloys thereof doped such to reduce bulk resistivity as far as assuming a value equal or lower than 1 $\Omega$cm, deposited by chemical vapor deposition (CVD, LPCVD and the like) in conformal manner way for a thickness from one to few tens of nanometers, on every surface of a sacrificial layer of a material deposited and then photolithographically defined on the substrate surface with a first masking step. A subsequent anisotropic etching of the conforally deposited layer removes it from horizontal surfaces, leaving it on vertical surfaces of definition of the sacrificial layer, according to a technique similar to that for forming the so-called dielectric spacers in microelectronics fabrication processes.

The sacrificial layer, typically a thick layer of oxide, nitride or silicon oxynitride of thickness greater than the height of the nanowires to be realized on the substrate surface, can be eliminated for example by dry (in plasma) or selective wet etching, leaving an array of structures of nanometric thickness (nanowires) and height corresponding to the thickness of the sacrificial layer, rising from the substrate surface and extending parallel to each other for the whole longitudinal dimension of the formation area of the substrate surface.

Obviously, the substrate material must eventually resist to the selective etching solution of the sacrificial layer of oxide and/or nitride. For example, in case of a substrate of glass or silica aerogel, it will need to be coated in advance with a protective film of polysilicon or other material of scarce or null electric conductivity, resistant to the etching solution of the sacrificial layer.

A dielectric material with reduced thermal conductivity can be then deposited such to fill the separation spaces (trenches) between adjacent nanowires in order to stabilize them mechanically, practically encapsulating the nanowires for their whole length onto the substrate surface. An aerogel made of silica or alumina or other oxide produced by applying and drying on site a sol-gel, represents an optimum stabilization material.

The two ends of the parallel nanometric structures (nanowires), spaced from one another, of the array thus formed onto an area of the substrate surface or even from one side to the other side of the substrate, are interconnected according to a certain series-parallel scheme and two terminal nodes of the whole series-parallel network of the array nanowires are thence connectable to an electrical circuit external to the bidirectional converter device (to an electrical load or to an electrical source).

The electrical interconnections of the ends of the parallelly extending nanowires can be realized with a second masking step to form openings on the areas coincident with the ends of the nanowires, on one and the other side of the area of formation of the nanowires, and depositing through the mask openings a metal or alloy of low Seebeck coefficient of metallization of the ends of the nanowires and of the separation areas between them on the substrate side. The openings intercept one or more pairs of ends of adjacent nanowires of the array of parallel nanowires along the opposite sides of termination, realizing a designed scheme of series-parallel interconnection and eventually also metallized pads to connect the Seebeck conversion device to an external circuit.

Through openings thus defined along the two parallel strips that intercept the ends of the nanowires, on one side and on the other one, the connecting metal, for example aluminium or alloy thereof is deposited optionally preceded by a flash deposition of a few nanometers thick compatibilization/adhesion film, for example of tungsten.

As evident from the above what description, the architecture of the Seebeck thermoelectric conversion device of the present invention allows its realization with common techniques and manufacturing apparatuses of relatively low cost, wherein the separation distance between adjacent nanowires of the array substantially corresponds to the minimum linewidth of photolithographic definition of the sacrificial layer of common manufacturing technologies based upon exposition of a masking fotoresist layer to luminous sources in the ultraviolet region. Nevertheless, the functioning structure of the conversion device has characteristics that make possible commercial production of highly efficient conversion devices at relatively low cost.

To these important features of the conversion structures of the present invention adds a specific pre-disposition to constitute robust and efficient "stacklike" multimodule architectures adapted to realize converters of relatively high voltage and power capabilities.

According to an alternative embodiment of the device, the nanowires extend for the whole width of the substrate and they are stabilized by a sufficiently thick layer exceeding the nanowires height over the whole surface of the substrate without performing any second masking or metallization step.

The surface of the encapsulating layer of silica aerogel may then be planarized by grinding and optionally also by possible lapping the upper surface of the aerogel layer until making it perfectly parallel to the bottom surface of the substrate.

The so-manufactured thin "tiles" lend themselves to be stacked one onto the other, gluing them, in a way to ensure perfect overlapping of respective corresponding geometrical details, as far as constituting a parallelepiped body constituted by a plurality of single identical modules pre-constituted as described above.

The two opposite faces of the parallelepiped body coincident with the opposite ends of the nanowires of the arrays of the stacked distinct modules, may be grinded, thus exposing the terminal surfaces of the nanowires.

On these opposite surfaces of the parallelepiped body may be defined relatively wide vertical or horizontal strips, intercepting the terminal surfaces of a certain number of nanowires, in a perfectly aligned (specular) mode on the two opposite terminal surfaces of the nanowires of all the stacked modules. On the strip areas a deposited metal layer, for example of aluminium, will short-circuit, on one and the other side, a certain number of nanowire ends of each module and eventually of homologous nanowires of the other stacked modules.

By connecting in series the groups of nanowires in parallel by wires or strips of metal defined on other two of sides of the parallelepiped body (on other elevation sides of the nanowires have been connected in parallel by defining "horizontal" strips of metal or on the upper surface and on the bottom surface if the nanowires have been connected in parallel by defining "vertical" strips of metal), an interconnection scheme of groups of nanowires in parallel, in series to other groups of nanowires in parallel according to a desired scheme, can be easily realized, in order to obtain at the terminals of the series/parallel network a sum voltage of the developed Seebeck voltage at the actual conditions of temperature difference of the two sensible sides of the device, at the two ends of the single nanowires, as well as a multiplied capability of deliverable current.

Definition of relatively wide areas on the two termination sides of the nanowires (the sensible sides of the Seebeck converter) and on the other pair of sides (for connecting in series groups of nanowires) of deposition of the contacting and connecting metal layer, allows the use of less sophisticated techniques for defining a suitable resist mask than those usually used to define micrometric or submicrometric openings. Moreover, it has been observed that the way of forming the nanowires by anisotropic etching in plasma of a conformally deposited matrix layer produces wrinkledness on the "vertical" surface of the nanowires exposed to the plasma which increases significantly the thermoelectric figure of merit by favoring an enhanced decoupling of the mean free path figures relative to phonons and to electrons because of scattering effects at surfaces.

Furthermore, it has been found that the nanowires of the arrays of the present invention can be subjected to a heavy implant of not reactive gaseous elements, such as for example helium. A subsequent heating of the implanted nanowires causes the formation of layers of nanobubbles at helium implantation depths that may be altered during implantation (using different kinetic energies of the ions). Formation of nanocavities in the material constituting the nanowires increases significantly the scattering of phonons contrasting heat conduction along the longitudinal direction of the nanowires without materially decreasing the electrical conductivity thereof.

The invention is more precisely defined by the annexed claims.

FIG. 1 is a layout schematic view of an exemplary conversion structure of a device of the invention.

Figure 1:
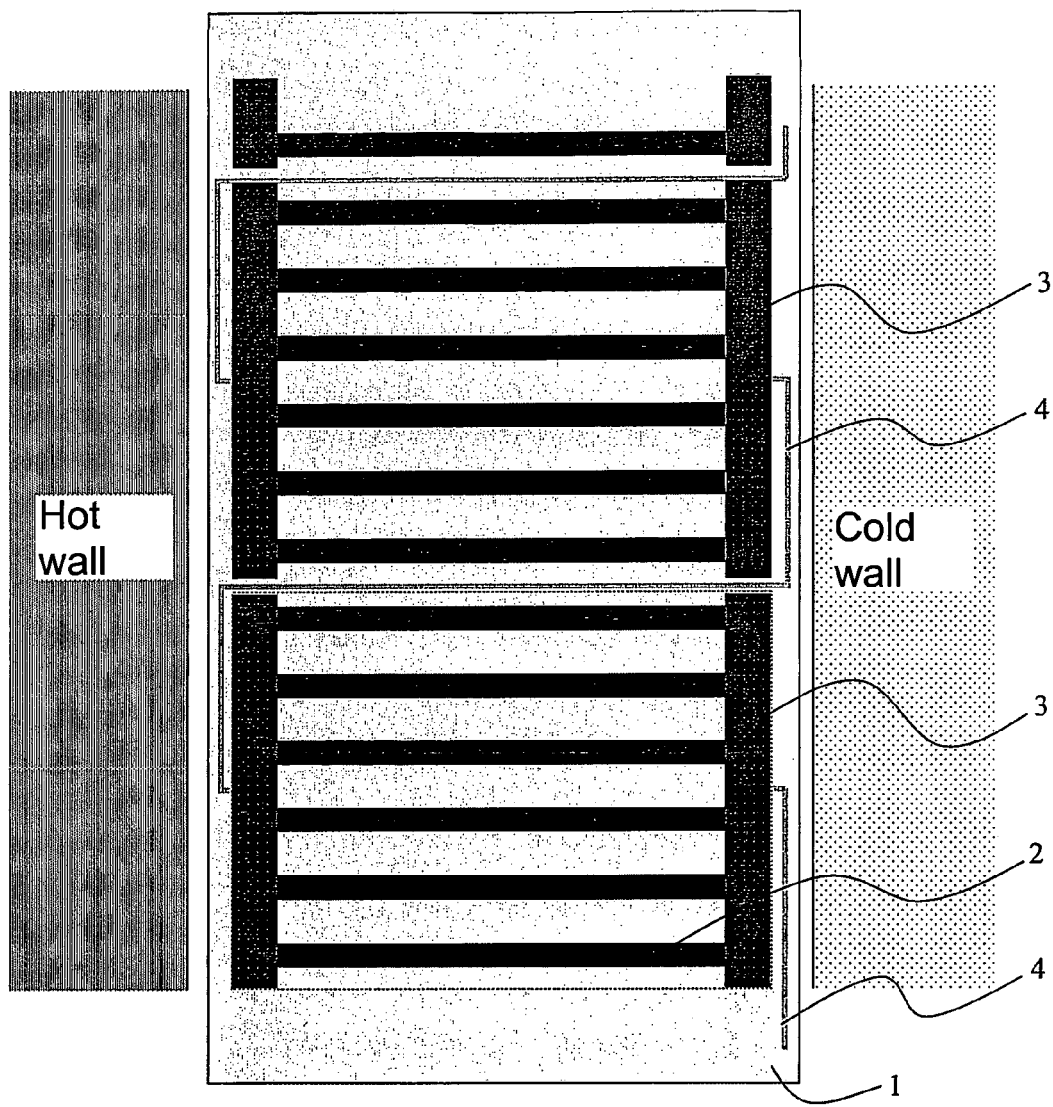
FIG. 1 is a layout schematic view of a Seebeck conversion device according to an embodiment of the present invention.

The substrate 1 can be a polymeric sheet resistant to high temperatures.

In the illustrated scheme can be observed the array of nanowires of polycrystalline silicon 2, extending parallelly and uniformly spaced from one side to the other of a surface of the substrate 1, According to the illustrated example, the array of nanowires is constituted by a plurality of rectangular rings of heavily doped polysilicon such an electric resistivity not in excess of 1 $\Omega$cm, a thickness (width) of about 20 nanometers and height of about 40 nanometers.

Uninterrupted strips of metal along opposite terminal areas of the rectangular rings of nanowires 2, connect in parallel groups of six nanowires 2 of the array.

Metallization of the opposite ends of the nanowires 2 is done using a specific non critical mask, defining aligned openings through which a metal or metal alloy 3, preferably with a low Seebeck coefficient, for example aluminium is deposited, on the areas identified by phantom dotted line, thus short-circuiting the ends of the nanowires on one side and on the other side of the structure. Wires of electrical connection 4 may be bonded to the metal layer, in order to connect in series adjacent groups of nanowires and, in case the two extreme groups of the electrical series to terminal pads adapted to connect the conversion device to an external circuit.

The opposite end surfaces of the so-implemented array of parallel nanowires are thermally coupled to a hot wall and to a cold wall, respectively, for generating by Seebeck effect, a voltage corresponding to the Seebeck voltage induced by the temperature difference on each nanowire 2, multiplied by the number of groups of nanowires electrically connected in series between two terminals connecting the converter to an external load.

Obviously, the converter device is bidirectional, as it can operate as voltage generator or as heat pump by forcing with an electric current along the nanowires with an external electrical source causing heat extraction from a wall (being cooled) to the other wall (being heated).

Figure 2:
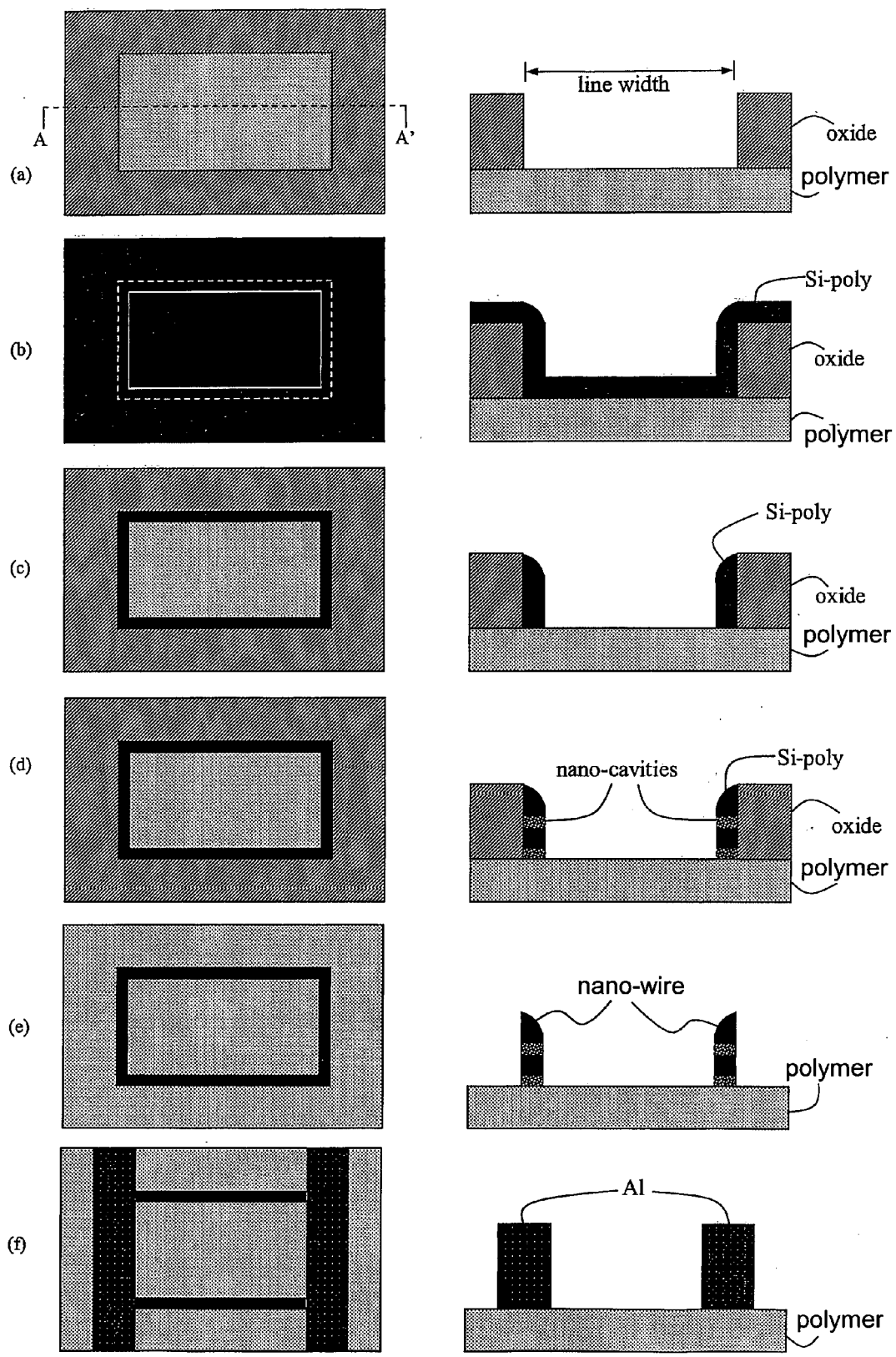
FIG. 2 illustrates some phases of the manufacturing process of the device structure of FIG. 1.

FIG. 2 shows a series of pairs of schematic layout and cross sectional views that illustrate significative steps of a manufacturing process of a conversion structure of the example illustrated in FIG. 1.

The views (a) of FIG. 2 show schematically a polymer substrate, stable at the process temperatures, on a face of which have been defined narrow rectangular cavities of identical size and orientation, by deposition, masking and anisotropically etching in plasma sacrificial layer of oxide, as were observed in FIG. 1.

The process continues with the deposition, under highly conformal conditions, for example by chemical deposition process (CVD, LPCVD or alike) carried out in a cold wall reactor, of a polycrystalline electrically conductive layer of conductive material, for example silicon.

According to common practice, the CVD process is based upon the pyrolitic decomposition of a suitable gaseous precursor, such as for example silane ($SiH_4$) or germane ($GeH_4$) or chlorosilane ($SiH_nCl_{4-n}$) at a temperature of about 600° C. and in any case chosen in a temperature range comprised between 500 and 900° C., in presence of also a precursor of the dopant species. A highly conformal conductive film with a thickness of about 20 nm, is thus formed as illustrated in (b).

As illustrated in (c), an anisotropic etching in plasma of the conductor polycrystalline material layer is carried out as far as removing it entirely from "horizontal" surfaces, practically leaving unchanged the thickness of the layer onto the "vertical" surfaces, with respect to the direction of anisotropic etching in plasma.

Optionally, the so-formed article can be subjected to a heavy implantation of helium ions in a dose apt to cause the formation of nanobubbles inside the layer of polysilicon of nanometric thickness and which during the heating in oven subsequent to implantation at the highest temperature tolerated by the substrate material and preferably between about 400 and about 900° C., for several hours, will be released from the material at least partially, leaving nanocavities within it. Implantation can be repeated at gradually different implantation energies, for example a first implantation at an energy of 50 keV, followed by other implantations with decreasing energies, each implantation performed in doses of about $2\times10^{16}$ cm$^2$, such to form inside the polycrystalline layer nanocavities at different depths, as schematically illustrated in (d).

The subsequent step of the process contemplates the elimination of the sacrificial oxide layer, that may be easily done by selective wet etching of the oxide against both the substrate polymer and the crystalline silicon constituting the nanowires rising from the substrate surface, as illustrated in (e).

It is even possible to conformally deposit the mother layer of electrically conductive material from which the elements of nanometric thickness (nanowires) will be obtained with a larger width, such to allow repeated implantations of helium ions at different implantation energies as described above, for reducing the risk of causing fractures or failures of the residual "spacers" on the "vertical" surfaces of definition the sacrificial oxide layer and, only when the treatment is completed, conducting an additional anisotropic etching in plasma with a not null incidence angle with respect to the vertical axis, for reducing the over-dimensioning of the thickness of the spacers to the wished nanometric size of the nanowires already subjected to energetic implantation and release of helium.

The illustrations (f) show the structure being manufactured after having formed a second (non critical) fotoresist mask to define aluminium metal deposition openings over the terminations, on one side and on the other side of the rectangular annular structures of the nanowires and after having removed the masking fotoresist by ashing it.

At this point, deposition of a stabilization layer according to what previously described will follow.

BIBLIOGRAPHY

[1] D. K. C. MacDonald, *Thermoelectricity: An Introduction to the Principles* (Wiley, New York, 1962).

[2] A. I. Hochbaum, R. K. Chen, R. D. Delgado, W. J. Liang, E. C. Garnett, M. Najarian, A. Majumdar, and P. D. Yang, Nature 451, 163-U5 (2008).

[3] A. I. Boukai, Y. Bunimovich, J. Tahir-Kheli, J.-K. Yu, W. A. Goddard Iii, and J. R. Heath, Nature 451, 168-171 (2008).

[4] G. F. Cerofolini, G. Arena, M. Camalleri, C. Galati, S. Reina, L. Renna, D. Mascolo, and V. Nosik, Microelectronic Engineering 81, 405-419 (2005).

[5] G. F. Cerofolini, G. Arena, C. M. Camalleri, C. Galati, S. Reina, L. Renna, and D. Mascolo, Nanotechnology 16, 1040-1047 (2005).

[6] Y. K. Choi, J. S. Lee, J. Zhu, G. A. Somorjai, L. P. Lee, and J. Bokor, Journal of Vacuum Science & Technology B 21, 2951-2955 (2003).

[7] Y. K. Choi, J. Zhu, J. Grunes, J. Bokor, and G. A. Somorjai, Journal of Physical Chemistry B 107, 3340-3343 (2003).

[8] D. C. Flanders and N. N. Efremow, Journal of Vacuum Science & Technology B 1, 1105-1108 (1983).

[9] W. R. Hunter, T. C. Holloway, P. K. Chatterjee, and A. F. Tasch, Jr., IEEE Electron Device Letters EDL-2, 4-6 (1981).

[10] G. F. Cerofolini, Nanotechnology E-Newsletter 7, 5 (2005).

[11] R. Tonini, F. Corni, S. Frabboni, G. Ottaviani, and G. F. Cerofolini, Journal of Applied Physics 84, 4802-4808 (1998).

The invention claimed is:

1. A Seebeck/Peltier effect bidirectional thermoelectric conversion device comprising a stack of a plurality of identical device modules, stacked to form a parallelepiped body,
wherein each module comprises:
(a) a substrate (1) having a planar surface;
(b) a plurality of nanowires comprising silicon,
wherein each of the plurality of nanowires has a length defined by the nanowires' longest physical dimension and a cross-sectional area defined by a height and a width;
wherein each of the plurality of nanowires directly contacts the substrate along the length of each of the plurality of nanowires;
wherein the height or the width of each of the plurality of nanowires is less than 40 nanometers;
wherein the silicon of each of the plurality of nanowires is doped to reduce bulk resistivity to a value equal to or lower than 1 ohm-cm;
(c) a layer of dielectric material having thermal conductivity lower than that of said substrate (1) and deposited on said plurality of nanowires and on said substrate, said layer of dielectric material having a thickness greater than the height or the width of the plurality of nanowires (2), filling the separation spaces between the plurality of nanowires and completely embedding the plurality of nanowires for their whole length along said longest physical dimension onto the substrate surface except for the opposite end surfaces at opposite sides of the plurality of nanowires;
electrical connection metal layers (3) deposited on and contacting opposite faces of said parallelepiped body at the opposite end surfaces of the plurality of nanowires (2) of all said identical device modules surface;
defined portions or segments of said electrical connection metal layers (3) on one and the other of said opposite faces of the parallelepiped body connecting in parallel the plurality of nanowires for creating groups of nanowires; electrical wires (4) bonded to said defined portions or segments of said electrical connection metal layers (3) connecting in series said groups of nanowires to an electrical circuit;
said defined portions or segments of metal layers (3) connecting the end surfaces of the groups of nanowires, on the opposite faces of the parallelepiped body constituting surfaces at different temperatures of the thermoelectric conversion device; and
wherein the substrate (1) has a thermal conductivity lower than that of the plurality of nanowires.

2. The device according to claim 1, characterized in that said plurality of nanowires are formed by conformally depositing on the whole formation area of said plurality of nanowires after defining thereon by photolithography parallel channels with vertical etch surfaces in a sacrificial layer of uniform thickness not lower than the height of the plurality of nanowires to be formed, of a material belonging to the group consisting of silicon oxide, silicon oxi-nitride and silicon nitride or mixtures of the same, and subsequent anisotropically etching in plasma the conformally deposited layer of the material constituting the plurality of nanowires on planar surfaces, and removal of residues of said photolithographically defined sacrificial layer by selective wet etching.

3. The device according to claim 1, characterized in that said substrate comprises a material belonging to the group consisting of mono or multi-component glass, silica aerogel, silicon without or with a low concentration of dopants, polymeric materials resistant to process and functioning temperatures of the conversion device.

4. The device according to claim 3, wherein said substrate is a monolith of silica aerogel coated with a film of undoped polycrystalline silicon.

5. The device according to claim 3, wherein said substrate is a stiff organic polymeric monolith.

6. The device according to claim 5, wherein said stiff monolith is of expanded organic polymer.

7. The device according to claim 3, wherein said substrate is a monolith of compact material having a lower face and an upper face and having a plurality of grooves on said lower face or inner cavities transversal to the direction of extension of said plurality of nanowires laying on said upper face.

8. The device according to claim 1, characterized in that said layer of dielectric material of low heat conductivity is an aerogel of silica or alumina or other oxide produced by application and drying of a sol-gel.

9. The conversion device according to claim 1, characterized in that said electrical connection metal layers are of a metal or metallic alloy having a low Seebeck coefficient.

10. The conversion device according to claim 9, comprising a few nm thick compatibilization/adhesion film deposited by flashing.

11. The device according to claim 2, wherein a separation distance between adjacent nanowires of said plurality of nanowires corresponds to a minimum linewidth of photolithographic definition of the sacrificial layer.

12. The device according to claim 1, wherein the plurality of nanowires is comprised of polysilicon and has inner nanocavities obtained by implanting Helium in the plurality of nanowires and by heating of the plurality of nanowires.

13. The device according to claim 1, wherein a spacing between adjacent nanowires of the plurality of nanowires is greater than said width or height of each of the plurality of nanowires by at least an order of magnitude and corresponds to a minimum linewidth of photolithographic definition of a planar process of fabrication of the device.

* * * * *